(12) United States Patent
Kim et al.

(10) Patent No.: US 10,784,449 B2
(45) Date of Patent: Sep. 22, 2020

(54) PEROVSKITE COMPOUND, THIN LAYER COMPRISING THE PEROVSKITE COMPOUND, AND OPTOELECTRONIC DEVICE COMPRISING THE PEROVSKITE COMPOUND

(71) Applicant: Samsung Display Co., Ltd., Yongin-si, Gyeonggi-do (KR)

(72) Inventors: Dongchan Kim, Yongin-si (KR); Yoonhyeung Cho, Yongin-si (KR); Wonjong Kim, Yongin-si (KR); Eungdo Kim, Yongin-si (KR); Dongkyu Seo, Yongin-si (KR); Jonghyuk Lee, Yongin-si (KR); Jihye Lee, Yongin-si (KR); Sanghoon Yim, Yongin-si (KR); Wonsuk Han, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 544 days.

(21) Appl. No.: 15/485,080

(22) Filed: Apr. 11, 2017

(65) Prior Publication Data

US 2017/0294607 A1 Oct. 12, 2017

(30) Foreign Application Priority Data

Apr. 11, 2016 (KR) .................. 10-2016-0044256

(51) Int. Cl.
*H01L 51/54* (2006.01)
*C09K 11/06* (2006.01)
(Continued)

(52) U.S. Cl.
CPC .......... *H01L 51/0089* (2013.01); *C07F 5/003* (2013.01); *C09K 11/779* (2013.01); *Y02E 10/549* (2013.01)

(58) Field of Classification Search
CPC .............. C07C 211/63; H01L 51/0032; H01L 51/0089; H01L 51/009; H01L 51/50;
(Continued)

(56) References Cited

U.S. PATENT DOCUMENTS 5,882,548 A 3/1999 Liang et al.
6,420,056 B1 7/2002 Chondroudis et al.
(Continued)

FOREIGN PATENT DOCUMENTS

EP 2 942 826 A2 11/2015
KR 2001-0015084 2/2001
(Continued)

OTHER PUBLICATIONS

Mitzi et al. Chem. Mater. 1997, 9, 2990-2995. (Year: 1997).*
(Continued)

*Primary Examiner* — Andrew K Bohaty
(74) *Attorney, Agent, or Firm* — Lewis Roca Rothgerber Christie LLP

(57) ABSTRACT

A perovskite compound represented by Formula 1, a thin layer including the perovskite compound, and an optoelectronic device including the perovskite compound:

$$[A][B^1{}_n B^2{}_{(1-n)}][X]_3. \qquad \text{Formula 1}$$

In Formula 1, A may be at least one selected from a monovalent organic cation, monovalent inorganic cation, and combinations thereof; $B^1$ may be a thulium (II) ($Tm^{2+}$) ion; $B^2$ may be at least one divalent inorganic cation, where $B^2$ is free of (e.g., does not include) $Tm^{2+}$; n may be a real number that satisfies $0<n\leq1$; and X may be at least one monovalent anion.

20 Claims, 1 Drawing Sheet

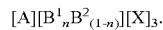

| 10 |
|---|
| 190 |
| 170 |
| 150 |
| 130 |
| 110 |

(51) Int. Cl.
H01L 51/00 (2006.01)
C09K 11/77 (2006.01)
C07F 5/00 (2006.01)

(58) Field of Classification Search
CPC .............. H01L 51/5036; H01L 51/5218; H01L 51/5262; H01L 51/5284; H01L 2251/5369; H01L 27/322
USPC ....... 428/690, 691, 917, 411.4, 336; 427/58, 427/66; 313/500–512; 257/40, 88–104, 257/E51.001–E51.052; 252/301.16–301.35
See application file for complete search history.

(56) References Cited

U.S. PATENT DOCUMENTS

| 2004/0043261 | A1* | 3/2004 | Dietrich | B64G 1/58 428/701 |
| 2004/0202893 | A1* | 10/2004 | Abe | C09K 11/06 428/690 |
| 2007/0145350 | A1* | 6/2007 | Kobori | H01L 27/322 257/13 |
| 2015/0136232 | A1 | 5/2015 | Snaith et al. | |

FOREIGN PATENT DOCUMENTS

| KR | 2001-0078173 | 8/2001 |
| KR | 10-2015-0011002 | 1/2015 |

OTHER PUBLICATIONS

Rogers, Edith, "Engineering the Electronic Structure of Lanthanide Based Materials", [Handbook], Dec. 18, 2012, 177 pages.

Borriello, Ivo., et al., "Ab Initio Investigation of Hybrid Organic-Inorganic Perovskites Based on Tin Halides", Physical Review, B 77, Jun. 2008, pp. 235214-1-235214-9.

Stoumpos, Constantinos. C., et al., "Semiconducting Tin and Lead Iodide Perovskites with Organic Cations: Phase Transitions, High Mobilities, and Near-Infrared Photoluminescent Properties", Inorganic Chemistry, 2013, vol. 52, pp. 9019-9038.

Liu, Mingzhen, et al., "Efficient Planar Heterojunction Perovskite Solar Cells by Vapour Deposition", Nature, Sep. 19, 2013, vol. 501, 8 pages.

Xu, Mei-Feng, et al., "A Low Temperature Gradual Annealing Scheme for Achieving High Performance Perovskite Solar Cells with no Hysteresis", J. Mater. Chem. A, 2015, 3, 14424-14430, 7 pages.

Castelli, Ivano, E., et al., "Bandgap Calculations and Trends of Organometal Halide Perovskites", AIP APL Materials, 2, 081514 (2014), 8 pages.

Ling, Yichuan, et al., "Bright Light-Emitting Diodes Based on Organometal Halide Perovskite Nanoplatelets", Adv. Mat., 2015, 7 pages.

Chen, Yonghua, et al., "Layer-by-Layer Growth of $CH_3NH_3PbI_{3-x}Cl_x$ for Highly Efficient Planar Heterojunction Perovskite Solar Cells", Adv. Mat., 2015, pp. 1053-1059.

Hossain, Mohammad I., et al., "Copper Oxide as Inorganic Hole Transport Material for Lead Halide Perovskite Based Solar Cells", http://dx.doi.org/10.1016/j.solener.2015.07.040, Solar Energy 120, Science Direct, 2015, pp. 370-380.

Chen Chun-Chao, et al., "Perovskite/Polymer Monolithic Hybrid Tandem Solar Cells Utilizing a Low-Temperature, Full Solution Process", The Royal Society of Chemistry, Materials Horizons, Jan. 20, 2015, 10 pages.

Rogers, E., et al., "Systematics in the Optical and Electronic Properties of the Binary Lanthanide Halide, Chalcogenide and Pnictide Compounds: An Overview", New Journal of Physics, vol. 13, 2011, 33 pages.

Poglitsch, A. et al., "Dynamic disorder in methylammoniumtrihalogenoplumbates (II) observed by millimeterwave spectroscopy," The Journal of Chemical Physics, vol. 87, Dec. 1987, pp. 6373-6378.

Tan, Zhi-Kuang et al., "Bright light-emitting diodes based on organometal halide perovskite," Nature Nanotechnology, 2014, pp. 1-6.

* cited by examiner

10

| 190 |
|---|
| 170 |
| 150 |
| 130 |
| 110 |

PEROVSKITE COMPOUND, THIN LAYER COMPRISING THE PEROVSKITE COMPOUND, AND OPTOELECTRONIC DEVICE COMPRISING THE PEROVSKITE COMPOUND

CROSS-REFERENCE TO RELATED APPLICATION

This application claims priority to and the benefit of Korean Patent Application No. 10-2016-0044256, filed on Apr. 11, 2016, in the Korean Intellectual Property Office, the entire content of which is incorporated herein by reference.

BACKGROUND

1. Field

One or more example embodiments of the present disclosure are related to a perovskite compound, a thin layer comprising the perovskite compound, and an optoelectronic device comprising the perovskite compound.

2. Description of the Related Art

A perovskite compound belongs to a class of materials having a three-dimensional crystal structure related to (e.g., similar to) that of $CaTiO_3$, and may be used in one or more suitable electronic devices.

The perovskite compound may be used as a light-emitting material, an electrode material, a light-sensing material, and/or a light-absorbing material in an optoelectronic device.

However, perovskite compounds may be limited in terms of manufacturing an optoelectronic device having high efficiency and long lifespan, and improvement is needed in this regard.

SUMMARY

One or more example embodiments of the present disclosure are directed toward a novel perovskite compound that may be used in manufacturing of a high quality optoelectronic device.

One or more example embodiments of the present disclosure are directed toward a thin layer including the perovskite compound and an optoelectronic device including the perovskite compound.

Additional aspects will be set forth in part in the description which follows and, in part, will be apparent from the description, or may be learned by practice of the presented embodiments.

One or more example embodiments of the present disclosure provide a perovskite compound represented by Formula 1:

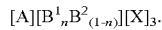

In Formula 1,

A may be at least one selected from a monovalent organic cation, a monovalent inorganic cation, and combinations thereof;

$B^1$ may be a thulium(II) ($Tm^{2+}$) ion;

$B^2$ may be at least one divalent inorganic cation, where $B^2$ is free of (e.g., does not include) $Tm^{2+}$;

n may be a real number that satisfies $0 < n \leq 1$; and

X may be at least one monovalent anion.

One or more example embodiments of the present disclosure provide a thin layer including the perovskite compound.

One or more example embodiments of the present disclosure provide an optoelectronic device including the perovskite compound.

BRIEF DESCRIPTION OF THE DRAWINGS

These and/or other aspects will become apparent and more readily appreciated from the following description of example embodiments, taken in conjunction with the accompanying drawing.

The drawing is a schematic view of a structure of a light-emitting device as an embodiment of an optoelectronic device.

DETAILED DESCRIPTION

Reference will now be made in more detail to embodiments, examples of which are illustrated in the accompanying drawings, wherein like reference numerals refer to like elements throughout and duplicative descriptions may not be provided. In this regard, the present embodiments may have different forms and should not be construed as being limited to the descriptions set forth herein. Accordingly, the embodiments are merely described below, by referring to the drawing, to explain aspects of the present description. As used herein, the term "and/or" includes any and all combinations of one or more of the associated listed items. Expressions such as "at least one of", "one of", and "selected from", when preceding a list of elements, modify the entire list of elements and do not modify the individual elements of the list.

The thicknesses of layers, films, panels, regions, etc., may be exaggerated in the drawings for clarity. It will be understood that when an element such as a layer, film, region, or substrate is referred to as being "on" another element, it may be directly on the other element or intervening element(s) may also be present. In contrast, when an element is referred to as being "directly on" another element, no intervening elements are present.

As used herein, the terms "combination", "combination thereof", and "combinations thereof" may refer to a chemical combination (e.g., an alloy or chemical compound), a mixture, or a laminated structure of components.

A perovskite compound according to an embodiment of the present disclosure may be represented by Formula 1:

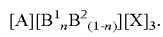

In Formula 1, A may be at least one selected from a monovalent organic cation, a monovalent inorganic cation, and combinations thereof.

For example, A may be: i) one monovalent organic cation, ii) one monovalent inorganic cation, iii) a combination of at least two different monovalent organic cations, iv) a combination of at least two different monovalent inorganic cations, or v) a combination of at least one monovalent organic cation and at least one monovalent-inorganic cation.

In one embodiment, in Formula 1,

A may be $(R_1R_2R_3R_4N)^+$, $(R_1R_2R_3R_4P)^+$, $(R_1R_2R_3R_4As)^+$, $(R_1R_2R_3R_4Sb)^+$, $(R_1R_2N=C(R_3)-NR_4R_5)^+$, a monovalent cation of a substituted or unsubstituted nitrogen-containing 5-membered ring, a monovalent cation of a substituted or unsubstituted nitrogen-containing 6-membered ring, lithium(I) ($Li^+$), sodium(I) ($Na^+$), potassium(I) ($K^+$), rubidium(I) ($Rb^+$), cesium(I) ($Cs^+$), francium(I) ($Fr^+$), or a combination thereof, wherein $R_1$ to $R_5$, a substituent of the monovalent cation of the substituted nitrogen-containing 5-membered ring, and a substituent of the monovalent cation of the substituted nitrogen-containing 6-membered ring may each independently be selected from a hydrogen atom, a deuterium atom, —F, —Cl, —Br, —I, a hydroxyl group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_6$-$C_{60}$ aryl group, and —N($Q_1$)($Q_2$)($Q_3$), wherein $Q_1$ to $Q_3$ may each independently be selected from a hydrogen atom, a deuterium atom, a hydroxyl group, a $C_1$-$C_{60}$ alkyl group, a $C_2$-$C_{60}$ alkenyl group, a $C_2$-$C_{60}$ alkynyl group, a $C_1$-$C_{60}$ alkoxy group, and a $C_6$-$C_{60}$ aryl group.

As used herein, the terms "nitrogen-containing 5-membered ring" and "nitrogen-containing 6-membered ring" denote organic cyclic groups that include at least one N and at least one C as ring-forming atoms. For example, the "nitrogen-containing 5-membered ring" may be an imidazole, a pyrazole, a thiazole, an oxazole, a pyrrolidine, a pyrroline, a pyrrole, or a triazole, and the "nitrogen-containing 6-membered ring" may be a pyridine, a pyridazine, a pyrimidine, a pyrazine, or a piperidine, but embodiments of the present disclosure are not limited thereto.

For example, in Formula 1, A may be $(R_1R_2R_3R_4N)^+$, $(R_1R_2R_3R_4P)^+$, $(R_1R_2R_3R_4As)^+$, $(R_1R_2R_3R_4Sb)^+$, $(R_1R_2N=C(R_3)-NR_4R_5)^+$, a substituted or unsubstituted imidazolium, a substituted or unsubstituted pyridinium, a substituted or unsubstituted pyridazinium, a substituted or unsubstituted pyrimidinium, a substituted or unsubstituted pyrazinium, a substituted or unsubstituted pyrazolium, a substituted or unsubstituted thiazolium, a substituted or unsubstituted oxazolium, a substituted or unsubstituted piperidinium, a substituted or unsubstituted pyrrolidinium, a substituted or unsubstituted pyrrolinium, a substituted or unsubstituted pyrrolium, a substituted or unsubstituted triazolium, $Li^+$, $Na^+$, $K^+$, $Rb^+$, $Cs^+$, $Fr^+$, or a combination thereof, wherein $R_1$ to $R_5$, a substituent of the substituted imidazolium, a substituent of the substituted pyridinium, a substituent of the substituted pyridazinium, a substituent of the substituted pyrimidinium, a substituent of the substituted pyrazinium, a substituent of the substituted pyrazolium, a substituent of the substituted thiazolium, a substituent of the substituted oxazolium, a substituent of the substituted piperidinium, a substituent of the substituted pyrrolidinium, a substituent of the substituted pyrrolinium, a substituent of the substituted pyrrolium, and a substituent of the substituted triazolium may each independently be selected from the group consisting of:

a hydrogen atom, a deuterium atom, —F, —Cl, —Br, —I, a hydroxyl group, a $C_1$-$C_{20}$ alkyl group, and a $C_1$-$C_{20}$ alkoxy group;

a $C_1$-$C_{20}$ alkyl group and a $C_1$-$C_{20}$ alkoxy group, each substituted with at least one selected from a deuterium atom, —F, —Cl, —Br, —I, and a hydroxyl group;

a phenyl group, a naphthyl group, a biphenyl group, and a terphenyl group;

a phenyl group, a naphthyl group, a biphenyl group, and a terphenyl group, each substituted with at least one selected from a deuterium atom, —F, —Cl, —Br, —I, a hydroxyl group, a $C_1$-$C_{20}$ alkyl group, and a $C_1$-$C_{20}$ alkoxy group; and —N($Q_1$)($Q_2$)($Q_3$), wherein $Q_1$ to $Q_3$ may each independently be selected from a hydrogen atom, a deuterium atom, a hydroxyl group, a $C_1$-$C_{20}$ alkyl group, a $C_1$-$C_{20}$ alkoxy group, a phenyl group, a naphthyl group, a biphenyl group, and a terphenyl group, but embodiments of the present disclosure are not limited thereto.

In one or more embodiments, in Formula 1, A may be $(R_1R_2R_3R_4N)^+$, $(R_1R_2R_3R_4P)^+$, $(R_1R_2R_3R_4As)^+$, $(R_1R_2R_3R_4Sb)^+$, or a combination thereof, wherein $R_1$ to $R_4$ may each independently be selected from a hydrogen atom, a deuterium atom, —F, —Cl, —Br, —I, a hydroxyl group, a $C_1$-$C_{20}$ alkyl group, a $C_1$-$C_{20}$ alkoxy group, and —N($Q_1$)($Q_2$)($Q_3$), wherein $Q_1$ to $Q_3$ may each independently be selected from a hydrogen atom, a deuterium atom, a hydroxyl group, a $C_1$-$C_{20}$ alkyl group, and a $C_1$-$C_{20}$ alkoxy group.

In one or more embodiments, in Formula 1, A may be $(R_1R_2R_3R_4N)^+$.

In one or more embodiments, in Formula 1, A may be $(CH_3NH_3)^+$, $(C_2H_6PH_2)^+$, $(CH_3AsH_3)^+$, $(NH_4)^+$, $(CH_3SbH_3)^+$, $(PH_4)^+$, $(PF_4)^+$, $(CH_3PH_3)^+$, $(SbH_4)^+$, $(AsH_4)^+$, $(NCl_4)^+$, $(NH_3OH)^+$, $(NH_3NH_2)^+$, $(CH(NH_2)_2)^+$, $(C_3N_2H_5)^+$, $((CH_3)_2NH_2)^+$, $(NC_4H_8)^+$, $((CH_3CH_2)NH_3)^+$, $((NH_2)_3C)^+$, or a combination thereof, but embodiments of the present disclosure are not limited thereto.

In Formula 1, $B^1$ may be a $Tm^{2+}$ ion.

In Formula 1, $B^2$ may be at least one divalent inorganic cation, where $B^2$ is free of (e.g., does not include a) $Tm^{2+}$ ion. As used herein, the term "free of" refers to that the recited component is not substantially present, or may be present only as an incidental impurity. In some embodiments, $B^2$ may be completely free of the $Tm^{2+}$ ion.

For example, in Formula 1, $B^2$ may be: i) one divalent inorganic cation, or ii) a combination of at least two different inorganic cations.

In one embodiment of the present disclosure, in Formula 1, $B^2$ may be a divalent cation of a rare earth metal, a divalent cation of an alkaline earth metal, or a combination thereof.

In one or more embodiments, in Formula 1, $B^2$ may be lanthanum(II) ($La^{2+}$), cerium(II) ($Ce^{2+}$), praseodymium(II) ($Pr^{2+}$), neodymium(II) ($Nd^{2+}$), promethium(II) ($Pm^{2+}$), europium(II) ($Eu^{2+}$), gadolinium(II) ($Gd^{2+}$), terbium(II) ($Tb^{2+}$), holmium(II) ($Ho^{2+}$), erbium(II) ($Er^{2+}$), ytterbium(II) ($Yb^{2+}$), lutetium(II) ($Lu^{2+}$), beryllium(II) ($Be^{2+}$), magnesium(II) ($Mg^{2+}$), calcium(II) ($Ca^{2+}$), strontium(II) ($Sr^{2+}$), barium(II) ($Ba^{2+}$), radium(II) ($Ra^{2+}$), or a combination thereof.

In one or more embodiments, in Formula 1, $B^2$ may be $Eu^{2+}$, but embodiments of the present disclosure are not limited thereto.

In Formula 1, n may be a real number that satisfies $0<n\le1$. In Formula 1, since n is not 0, the perovskite compound represented by Formula 1 essentially includes $Tm^{2+}$.

In one or more embodiments, in Formula 1, n may be a real number that satisfies $0<n\le0.6$. In some embodiments, n may be a real number that satisfies $0.001\le n\le0.6$; and in some embodiments, n may be a real number that satisfies $0.05\le n\le0.4$. In Formula 1, when n is within these ranges, an optoelectronic device including the perovskite compound or, for example, a light-emitting diode including the perovskite compound may effectively emit light in the visible spectral wavelength range.

In one or more embodiments, in Formula 1, the color of light emitted from the perovskite compound may be controlled by controlling the range of n.

For example, i) n in Formula 1 may be a real number that satisfies $0.01 \leq n \leq 0.14$, and the perovskite compound may emit blue light, ii) n in Formula 1 may be a real number that satisfies $0.15 \leq n \leq 0.34$, and the perovskite compound may emit green light, or iii) n in Formula 1 may be a real number that satisfies $0.35 \leq n \leq 0.5$, and the perovskite compound may emit red light, but embodiments of the present disclosure are not limited thereto.

In Formula 1, X may be at least one monovalent anion.

For example, in Formula 1, X may be: i) one monovalent anion, or ii) a combination of at least two different monovalent anions.

In one embodiment, in Formula 1, X may be at least one halide anion (e.g., —F, —Cl, —Br, or —I).

For example, in Formula 1, X may be: i) one halide anion, or ii) a combination of at least two different halide anions.

In one or more embodiments, in Formula 1, X may be —I (iodide), but embodiments of the present disclosure are not limited thereto.

The perovskite compound represented by Formula 1 may have an energy band gap of 4 eV or lower.

In Formula 1, n is not 0, and the perovskite compound represented by Formula 1 essentially includes $Tm^{2+}$. The Goldschmidt's tolerance factor (an indicator of structural stability and distortion of the perovskite) of the perovskite compound represented by Formula 1 may be substantially about 1. Without being bound to a particular theory, these results may be at least in part due to the fact that the tolerance factor of $(CH_3NH_3)EuI_3$ is about 0.917 and the tolerance factor of $(CH_3NH_3)TmI_3$ is about 0.957. Thus, the perovskite compound represented by Formula 1 may have high structural stability.

Therefore, for example, a thin layer including the perovskite compound represented by Formula 1 may have a high quantum efficiency (photoluminescence quantum yield, PLAY) and a narrow full-width at half maximum (FWHM). An optoelectronic device (e.g., a light-emitting diode or a solar battery) including the perovskite compound represented by Formula 1 may also have excellent efficiency (e.g., external quantum efficiency or luminous efficiency) and/or long lifespan.

According to another aspect of the present disclosure, provided is a thin layer including the perovskite compound represented by Formula 1.

The perovskite compound included in the thin layer may be the same as defined in the present specification.

The thin layer may be prepared by providing and heat-treating an A-containing precursor, a $B^1$-containing precursor, and a $B^2$-containing precursor on a substrate (e.g., a region where the thin layer is to be prepared) to form a thin layer including the perovskite compound represented by Formula 1.

In the A-containing precursor, $B^1$-containing precursor, and $B^2$-containing precursor, A, $B^1$, and $B^2$ may each be the same as described herein in connection with Formula 1 in the present specification.

The A-containing precursor may be selected from halide compounds of A (e.g., $(A)(X^1)$); the $B^1$-containing precursor may be selected from halide compounds of $B^1$ (e.g., $(B^1)(X^2)_2$; and the $B^2$-containing precursor may be selected from halide compounds of $B^2$ (e.g., $(B^2)(X^3)_2$). In $(A)(X^1)$, $(B^1)(X^2)_2$, and $(B^2)(X^3)_2$, A, $B^1$, and $B^2$ may each be the same as defined in the present specification, and $X^1$ to $X^3$ may each independently be selected from —F, —Cl, —Br, and —I.

In one embodiment, the A-containing precursor may be $CH_3NH_3I$, the $B^1$-containing precursor may be $TmI_2$, and the $B^2$-containing precursor may be $EuI_2$, but embodiments of the present disclosure are not limited thereto.

In one embodiment, the thin layer including the perovskite compound represented by Formula 1 may be prepared by concurrently (e.g., simultaneously) providing and heat-treating the A-containing precursor, the $B^1$-containing precursor, and the $B^2$-containing precursor on the substrate to form a thin layer including the perovskite compound represented by Formula 1 (e.g., a one-step method).

In one or more embodiments, the thin layer including the perovskite compound represented by Formula 1 may be prepared by providing the A-containing precursor, the $B^1$-containing precursor, and the $B^2$-containing precursor on the predetermined substrate to form a precursor-containing layer, and then subsequently heat-treating the precursor-containing layer to form a thin layer including the perovskite compound represented by Formula 1 (e.g., a two-step method).

In the thin layer preparation method, conditions for the heat-treating may vary, depending on whether A in the A-containing precursor includes a monovalent inorganic cation or not.

For example, i) when A does not include a monovalent inorganic cation, the heat-treating conditions in the thin layer preparation method may be selected from a time of about 15 minutes to about 1 hour and a temperature of about 100° C. to about 400° C., and ii) when A includes a monovalent inorganic cation, the heat-treating conditions in the thin layer preparation method may be selected from a time of about 2 hours to about 48 hours and a temperature of about 400° C. to about 800° C., but embodiments of the present disclosure are not limited thereto.

In some embodiments, the thin layer including the perovskite compound represented by Formula 1 may be prepared by providing a mixture including the perovskite compound represented by Formula 1 on the substrate and then heat-treating the substrate together with the mixture.

According to another aspect of the present disclosure, provided is an optoelectronic device including the perovskite compound represented by Formula 1.

The optoelectronic device may be a photovoltaic device, a photodiode, a phototransistor, a photomultiplier, a photoresistor, a photo-detector, a light sensitive detector, a solid-state triode, a battery electrode, a light-emitting device, a light-emitting diode, a transistor, a solar battery, a laser, or a diode injection laser, but embodiments of the present disclosure are not limited thereto.

The perovskite compound may be used as a light-emitting material (e.g., as a light-emitting material of a light-emitting diode including an emission layer), a charge transferring material (e.g., as a hole transport layer material of a light-emitting diode including a hole transport region), an electrode material, a light-sensing material, a light-absorbing material (e.g., as an active layer material of a solar battery), or a light-conversion material (e.g., as a color filter material when a light-emitting diode includes a color filter) of the optoelectronic device, but embodiments of the present disclosure are not limited thereto.

In one embodiment, the optoelectronic device may be a light-emitting diode, and the light-emitting diode may include a first electrode; a second electrode facing the first electrode; and an emission layer between the first electrode and the second electrode, wherein the perovskite compound may be included in the emission layer, but embodiments of the present disclosure are not limited thereto.

The light-emitting diode may further include at least one of a hole transport region between the first electrode and the emission layer; and an electron transport region between the emission layer and the second electrode.

At least one of the hole transport region and the electron transport region of the light-emitting diode may include an inorganic material.

For example, at least one of the hole transport region and the electron transport region of the light-emitting diode may include a metal halide, a metal oxide, a metal chalcogenide, a metal selenide, or a combination thereof.

Alternatively, at least one of the hole transport region and the electron transport region of the light-emitting diode may include:

a group IV semiconductor compound (e.g., a silicon carbide);

a group III-V semiconductor compound (e.g., a gallium arsenide);

a group II-VI semiconductor compound (e.g., a cadmium selenide);

a group I-VII semiconductor compound (e.g., a copper(I) chloride and/or CuI);

a group IV-VI semiconductor compound (e.g., a lead selenide);

a group V-VI semiconductor compound (e.g., a bismuth telluride);

a group II-V semiconductor compound (e.g., a cadmium arsenide);

a ternary or quaternary semiconductor compound (e.g., a copper indium selenide, a copper indium gallium diselenide, a copper zinc tin sulfide, and/or a copper zinc tin sulfide selenide (CZTSSe)); or a combination thereof, but embodiments of the present disclosure are not limited thereto.

For example, at least one of the hole transport region and the electron transport region of the light-emitting diode may include:

an oxide of titanium, an oxide of niobium, an oxide of tin, an oxide of zinc, an oxide of cadmium, an oxide of copper, an oxide of lead, or a combination thereof (e.g., an alloy);

a chalcogenide of antimony, a chalcogenide of copper, a chalcogenide of zinc, a chalcogenide of iron, a chalcogenide of bismuth (e.g., a copper sulfide and/or an iron sulfide), or a combination thereof (e.g., an alloy);

a copper zinc tin chalcogenide (e.g., a copper zinc tin sulfide such as $Cu_2ZnSnS_4$ (CZTS) and/or a copper zinc tin sulfur-selenide such as $Cu_2ZnSn(S_{1-x}Se_x)_4$ (CZTSSe));

a copper indium chalcogenide such as a copper indium selenide (CIS);

a copper indium gallium chalcogenide such as a copper indium gallium selenide ($CuIn_{1-x}Ga_xSe_2$) (CIGS);

a copper indium gallium diselenide; or a combination thereof, but embodiments of the present disclosure are not limited thereto. The subscript x may be selected from real numbers between 0 to 1.

In one or more embodiments, at least one of the hole transport region and the electron transport region may include an organic material.

In one embodiment, the hole transport region may include an amine-based compound, or the electron transport region may include a metal-free compound that includes at least one π electron deficient nitrogen-containing ring, but embodiments of the present disclosure are not limited thereto.

The organic material and additional materials that may be included in the hole transport region and the electron transport region may each be the same as described earlier herein.

According to another aspect of the present disclosure, the optoelectronic device may be a light-emitting diode, and the light-emitting diode may include a first electrode; a second electrode facing the first electrode; an emission layer between the first electrode and the second electrode; and at least one of a hole transport region between the first electrode and the emission layer and an electron transport region between the emission layer and the second electrode, wherein the perovskite compound may be included in at least one of the hole transport region and the electron transport region.

The light-emitting diode may further include the perovskite compound in the emission layer as well as in at least one of the hole transport region and the electron transport region.

DESCRIPTION OF THE DRAWING

The drawing is a schematic cross-sectional view of a light-emitting diode 10 according to an embodiment of the optoelectronic device. The light-emitting diode 10 includes a first electrode 110, a hole transport region 130, an emission layer 150, an electron transport region 170, and a second electrode 190.

Hereinafter, a structure and a preparation method of the light-emitting diode 10 according to an embodiment of the present disclosure will be described by referring to the drawing.

[First Electrode 110]

A substrate may be under the first electrode 110 or on the second electrode 190 of FIG. 1. The substrate may be a glass substrate or a plastic substrate, each having excellent mechanical strength, thermal stability, transparency, surface smoothness, ease of handling, and/or waterproofness.

The first electrode 110 may be, for example, formed by depositing and/or sputtering a first electrode material on the substrate. When the first electrode 110 is an anode, the first electrode material may be selected from a first electrode material that has a high work function in order to facilitate hole injection.

The first electrode 110 may be a reflective electrode, a semi-transmissive electrode, or a transmissive electrode. When the first electrode 110 is a transmissive electrode, the first electrode material may be selected from indium tin oxide (ITO), indium zinc oxide (IZO), tin oxide ($SnO_2$), zinc oxide (ZnO), and combinations thereof, but embodiments of the present disclosure are not limited thereto. When the first electrode 110 is a semi-transmissive electrode or a reflective electrode, the first electrode material may be selected from magnesium (Mg), silver (Ag), aluminum (Al), aluminum-lithium (Al—Li), calcium (Ca), magnesium-indium (Mg—In), magnesium-silver (Mg—Ag), and combinations thereof, but embodiments of the present disclosure are not limited thereto.

The first electrode 110 may have a single-layer structure or a multi-layer structure including two or more layers. For example, the first electrode 110 may have a triple-layer structure of ITO/Ag/ITO, but embodiments of the present disclosure are not limited thereto.

[Hole Transport Region 130]

The hole transport region 130 may have: i) a single-layered structure including (e.g., consisting) of a single material, ii) a single-layered structure including (e.g., consisting of) a plurality of different materials, or iii) a multi-layered structure having a plurality of layers including a plurality of different materials.

The hole transport region 130 may include at least one layer selected from a hole injection layer, a hole transport layer, an emission auxiliary layer, and an electron blocking layer.

For example, the hole transport region 130 may have a single-layered structure including (e.g., consisting of) a single material (e.g., consisting of a hole transport layer consisting of a single material), a single-layered structure including (e.g., consisting of) a plurality of different materials, or a structure of hole injection layer/hole transport layer, hole injection layer/hole transport layer/emission auxiliary layer, hole injection layer/emission auxiliary layer, hole transport layer/emission auxiliary layer, or hole injection layer/hole transport layer/electron blocking layer, wherein layers of each structure are sequentially stacked on the first electrode 110 in each stated order, but embodiments of the present disclosure are not limited thereto.

The hole transport region 130 may include an inorganic material as described above.

In some embodiments, the hole transport region 130 may include the perovskite compound represented by Formula 1 as described above.

In some embodiments, the hole transport region 130 may include an organic material.

Non-limiting examples of the organic material may include m-MTDATA, TDATA, 2-TNATA, NPB, β-NPB, TPD, Spiro-TPD, Spiro-NPB, methylated-NPB, TAPC, HMTPD, 4,4',4"-tris(N-carbazolyl)triphenylamine (TCTA), polyaniline/dodecylbenzenesulfonic acid (PANI/DBSA), poly(3,4-ethylenedioxythiophene)/poly(4-styrenesulfonate) (PEDOT/PSS), polyaniline/camphor sulfonic acid (PANI/CSA), and (polyaniline)/poly(4-styrenesulfonate) (PANI/PSS).

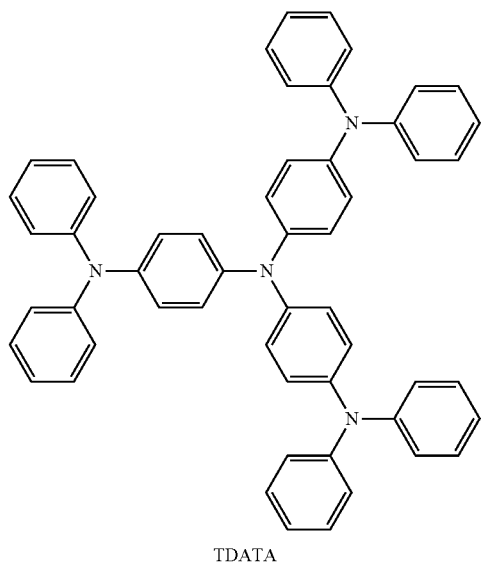

TDATA

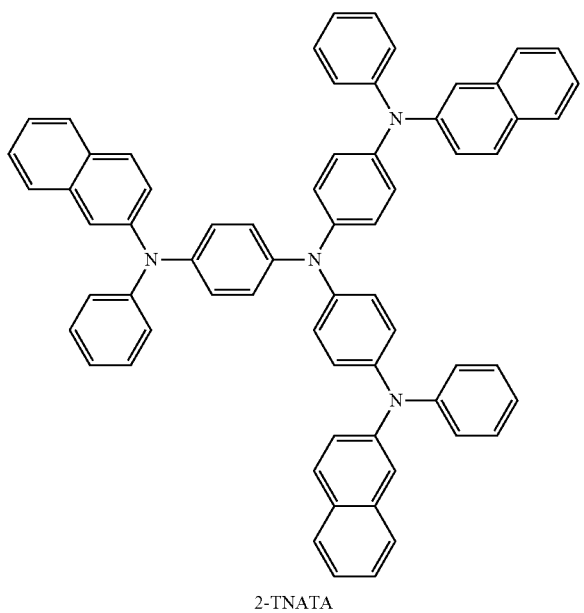

2-TNATA

m-MTDATA

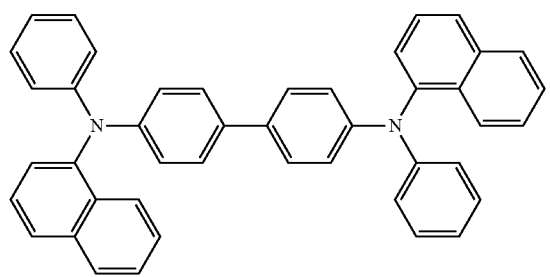

NPB

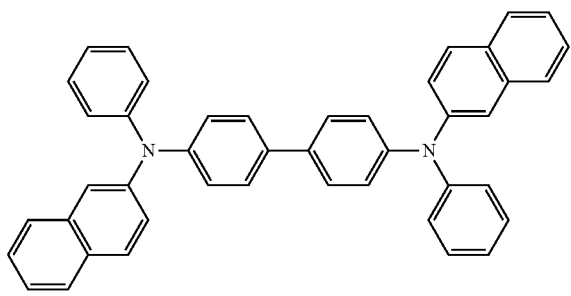

β-NPB

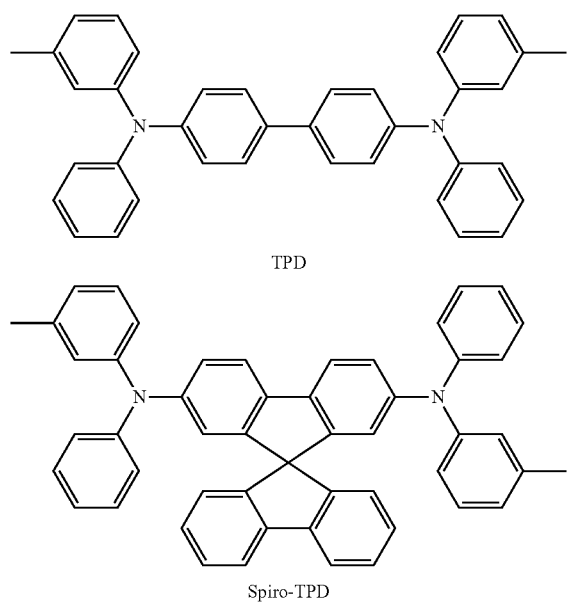

TPD

Spiro-TPD

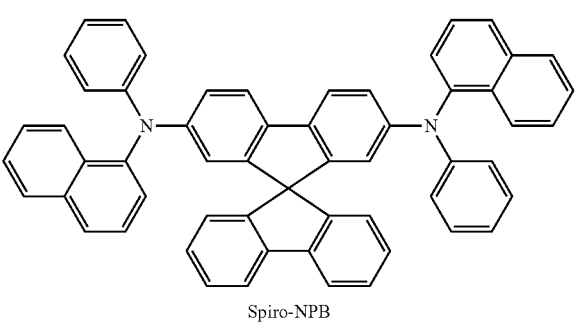

Spiro-NPB

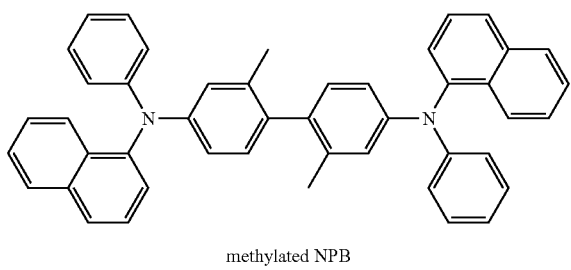

methylated NPB

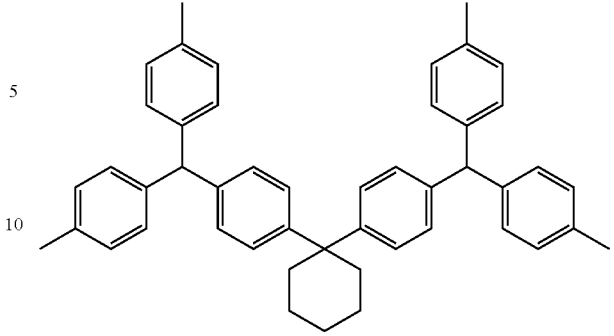

TAPC

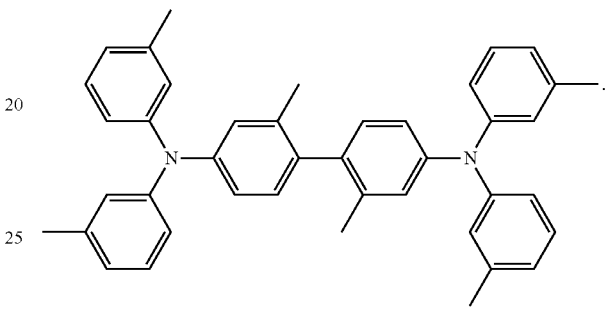

HMTPD

In one or more embodiments, the organic material may be an amine-based compound.

For example, the hole transport region 130 may include at least one selected from a compound represented by Formula 201 and a compound represented by Formula 202:

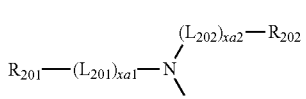

Formula 201

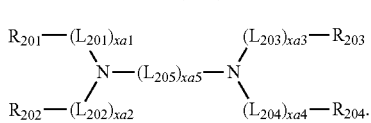

Formula 202

In Formulae 201 and 202, $L_{201}$ to $L_{204}$ may each independently be selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, $L_{205}$ may be selected from *—O—*', *—S—*', *—N($Q_{201}$)—*', a substituted or unsubstituted $C_1$-$C_{20}$ alkylene group, a substituted or unsubstituted $C_2$-$C_{20}$ alkenylene group, a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, xa1 to xa4 may each independently be an integer selected from 0 to 3, xa5 may be an integer selected from 1 to 10, and $R_{201}$ to $R_{204}$ and $Q_{201}$ may each independently be selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group.

For example, in Formula 202, $R_{201}$ and $R_{202}$ may be optionally linked (e.g., coupled) to each other through a single bond, a dimethyl-methylene group, or a diphenyl-methylene group, and $R_{203}$ and $R_{204}$ may be optionally linked (e.g., coupled) to each other through a single bond, a dimethyl-methylene group, or a diphenyl-methylene group.

In one embodiment, in Formulae 201 and 202, $L_{201}$ to $L_{205}$ may each independently be selected from the group consisting of:

a phenylene group, a pentalenylene group, an indenylene group, a naphthylene group, an azulenylene group, a heptalenylene group, an indacenylene group, an acenaphthylene group, a fluorenylene group, a spiro-bifluorenylene group, a benzofluorenylene group, a dibenzofluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pentacenylene group, a rubicenylene group, a coronenylene group, an ovalenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, and a pyridinylene group; and a phenylene group, a pentalenylene group, an indenylene group, a naphthylene group, an azulenylene group, a heptalenylene group, an indacenylene group, an acenaphthylene group, a fluorenylene group, a spiro-bifluorenylene group, a benzofluorenylene group, a dibenzofluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pentacenylene group, a rubicenylene group, a coronenylene group, an ovalenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, and a pyridinylene group, each substituted with at least one selected from a deuterium atom, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a phenyl group substituted with a $C_1$-$C_{10}$ alkyl group, a phenyl group substituted with —F, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, —Si($Q_{31}$)($Q_{32}$)($Q_{33}$), and —N($Q_{31}$)($Q_{32}$), wherein $Q_{31}$ to $Q_{33}$ may each independently be selected from a $C_1$-$C_{10}$ alkyl group, a $C_1$-$C_{10}$ alkoxy group, a phenyl group, a biphenyl group, a terphenyl group, and a naphthyl group.

In one or more embodiments, xa1 to xa4 may each independently be 0, 1, or 2.

In one or more embodiments, xa5 may be 1, 2, 3, or 4.

In one or more embodiments, $R_{201}$ to $R_{204}$ and $Q_{201}$ may each independently be selected from the group consisting of:

a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, and a pyridinyl group; and a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, and a pyridinyl group, each substituted with at least one selected from a deuterium atom, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a phenyl group substituted with a $C_1$-$C_{10}$ alkyl group, a phenyl group substituted with —F, a pentalenyl group, an indenyl group, a naphthyl group, an azulenyl group, a heptalenyl group, an indacenyl group, an acenaphthyl group, a fluorenyl group, a spirobifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, —Si$(Q_{31})(Q_{32})(Q_{33})$, and —N$(Q_{31})(Q_{32})$, wherein $Q_{31}$ to $Q_{33}$ may each be the same as defined in the present specification.

The thickness of the hole transport region 130 may be about 100 Å to about 10,000 Å, and in some embodiments, about 100 Å to about 1,000 Å. For example, when the hole transport region 130 includes at least one of a hole injection layer and a hole transport layer, the thickness of the hole injection layer may be about 100 Å to about 9,000 Å, and in some embodiments, about 100 Å to about 1,000 Å; the thickness of the hole transport layer may be about 50 Å to about 2,000 Å, and in some embodiments, about 100 Å to about 1,500 Å. When the thicknesses of the hole transport region 130, hole injection layer, and hole transport layer are each within these ranges, hole transport characteristics may be satisfactory without a substantial increase in driving voltage.

The emission auxiliary layer is a layer that may compensate for an optical resonance distance according to a wavelength of light emitted from the emission layer (e.g., may adjust the optical resonance distance to match the wavelength of light emitted from the emission layer) to thereby increase light-emission efficiency, and the electron blocking layer is a layer that may prevent or reduce injection of electrons from the electron transport region 170. The emission auxiliary layer and the electron blocking layer may include the materials described above.

The hole transport region 130 may further include a charge-generating material to increase conductivity, in addition to the materials described above. The charge-generating material may be homogeneously or non-homogeneously dispersed throughout the hole transport region 130.

The charge-generating material may be, for example, a p-dopant.

In one embodiment, the p-dopant may have a lowest unoccupied molecular orbital (LUMO) energy level of −3.5 eV or lower.

The p-dopant may include at least one selected from a quinone derivative, a metal oxide, and a cyano group-containing compound, but embodiments of the present disclosure are not limited thereto.

For example, the p-dopant may include at least one selected from the group consisting of:

a quinone derivative (such as tetracyanoquinonedimethane (TCNQ) and/or 2,3,5,6-tetrafluoro-tetracyano-1,4-benzoquinonedimethane (F4-TCNQ));

a metal oxide (such as a tungsten oxide and/or a molybdenum oxide);

1,4,5,8,9,11-hexaazatriphenylene-hexacarbonitrile (HAT-CN); and a compound represented by Formula 221, but embodiments of the present disclosure are not limited thereto:

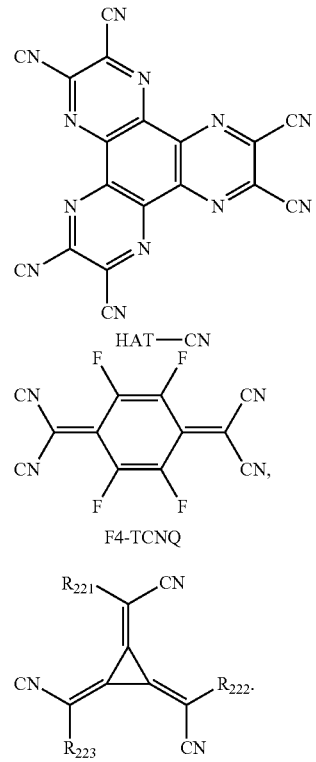

Formula 221

In Formula 221, $R_{221}$ to $R_{223}$ may each independently be selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group, wherein at least one of $R_{221}$ to $R_{223}$ has at least one substituent selected from a cyano group, —F, —Cl, —Br, —I, a $C_1$-$C_{20}$ alkyl group substituted with —F, a $C_1$-$C_{20}$ alkyl group substituted with —Cl, a $C_1$-$C_{20}$ alkyl group substituted with —Br, and a $C_1$-$C_{20}$ alkyl group substituted with —I.

[Emission Layer 150]

The emission layer 150 may include the perovskite compound represented by Formula 1. The method of forming the emission layer 150 may be substantially the same as the preparation method of a thin layer including a perovskite compound described herein.

The thickness of the emission layer 150 may be about 100 Å to about 1,000 Å, and in some embodiments, about 200 Å to about 600 Å. When the thickness of the emission layer 150 is within these ranges, excellent light-emission characteristics may be obtained without a substantial increase in driving voltage.

[Electron Transport Region 170]

The electron transport region 170 may have: i) a single-layered structure including (e.g., consisting of) a single material, ii) a single-layered structure including (e.g., consisting of) a plurality of different materials, or iii) a multi-layered structure having a plurality of layers formed of a plurality of different materials.

The electron transport region 170 may include at least one layer selected from a buffer layer, a hole blocking layer, an electron control layer, an electron transport layer, and an electron injection layer, but embodiments of the present disclosure are not limited thereto.

For example, the electron transport region 170 may have a structure of electron transport layer/electron injection layer, hole blocking layer/electron transport layer/electron injection layer, electron control layer/electron transport layer/electron injection layer, or buffer layer/electron transport layer/electron injection layer, wherein layers of each structure are sequentially stacked on the emission layer 150 in each stated order, but embodiments of the present disclosure are not limited thereto.

The electron transport region 170 may include an inorganic material. The inorganic material may be substantially the same as described above herein.

In one or more embodiments, the electron transport region 170 may include the perovskite compound represented by Formula 1.

In one or more embodiments, the electron transport region 170 may include an organic material.

The organic material that may be included in the electron transport region 170 may be a metal-free compound including at least one π electron deficient nitrogen-containing ring.

The term "π electron deficient nitrogen-containing ring" denotes a $C_1$-$C_{60}$ heterocyclic group that has at least one *—N=*' moiety as a ring-forming moiety.

For example, the "π electron deficient nitrogen-containing ring" may be: i) a 5-membered to 7-membered heteromonocyclic group having at least one *—N=*' moiety, ii) a heteropolycyclic group having at least one *—N=*' moiety, in which at least two 5-membered to 7-membered heteromonocyclic groups are condensed (e.g., fused), or iii) a heteropolycyclic group having at least one *—N=*' moiety, in which at least one 5-membered to 7-membered heteromonocyclic group and at least one $C_5$-$C_{60}$ carbocyclic group are condensed (e.g., fused).

Non-limiting examples of the π electron deficient nitrogen-containing ring may include an imidazole, a pyrazole, a thiazole, an isothiazole, an oxazole, an isoxazole, a pyridine, a pyrazine, a pyrimidine, a pyridazine, an indazole, a purine, a quinoline, an isoquinoline, a benzoquinoline, a phthalazine, a naphthyridine, a quinoxaline, a quinazoline, a cinnoline, a phenanthridine, an acridine, a phenanthroline, a phenazine, a benzimidazole, an isobenzothiazole, a benzoxazole, an isobenzoxazole, a triazole, a tetrazole, an oxadiazole, a triazine, a thiadiazole, an imidazopyridine, an imidazopyrimidine, and an azacarbazole, but embodiments of the present disclosure are not limited thereto.

For example, the electron transport region 170 may include a compound represented by Formula 601:

$$[Ar_{601}]_{xe11}\text{-}[(L_{601})_{xe1}\text{-}R_{601}]_{xe21}. \qquad \text{Formula 601}$$

In Formula 601, $Ar_{601}$ may be a substituted or unsubstituted $C_5$-$C_{60}$ carbocyclic group or a substituted or unsubstituted $C_1$-$C_{60}$ heterocyclic group, xe11 may be 1, 2, or 3, $L_{601}$ may be selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, xe1 may be an integer selected from 0 to 5, and $R_{601}$ may be selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —Si($Q_{601}$)($Q_{602}$)($Q_{603}$), —C(=O)($Q_{601}$), —S(=O)$_2$($Q_{601}$), and —P(=O)($Q_{601}$)($Q_{602}$), wherein $Q_{601}$ to $Q_{603}$ may each independently be selected from a $C_1$-$C_{10}$ alkyl group, a $C_1$-$C_{10}$ alkoxy group, a phenyl group, a biphenyl group, a terphenyl group, and a naphthyl group, and xe21 may be an integer selected from 1 to 5.

In one embodiment, at least one of the xe11 $Ar_{601}$(s) and the xe21 $R_{601}$(s) may include the π electron deficient nitrogen-containing ring described above.

In one embodiment, in Formula 601, $Ar_{601}$ may be selected from the group consisting of:

a benzene group, a naphthalene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentaphene group, an indenoanthracene group, a dibenzofuran group, a dibenzothiophene group, a carbazole group, an imidazole group, a pyrazole group, a thiazole group, an isothiazole group, an oxazole group, an isoxazole group, a pyridine group, a pyrazine group, a pyrimidine group, a pyridazine group, an indazole group, a purine group, a quinoline group, an isoquinoline group, a benzoquinoline group, a phthalazine group, a naphthyridine group, a quinoxaline group, a quinazoline group, a cinnoline group, a phenanthridine group, an acridine group, a phenanthroline group, a phenazine group, a benzimidazole group, an isobenzothiazole group, a benzoxazole group, an isobenzoxazole group, a triazole group, a tetrazole group, an oxadiazole group, a triazine group, a thiadiazole group, an imidazopyridine group, an imidazopyrimidine group, and an azacarbazole group; and a benzene group, a naphthalene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentaphene group, an indenoanthracene group, a dibenzofuran group, a dibenzothiophene group, a carbazole group, an imidazole group, a pyrazole group, a thiazole group, an isothiazole group, an oxazole group, an isoxazole group, a pyridine group, a pyrazine group, a pyrimidine group, a pyridazine group, an indazole group, a purine group, a quinoline group, an isoquinoline group, a benzoquinoline group, a phthalazine group, a naphthyridine group, a quinoxaline group, a quinazoline group, a cinnoline group, a phenanthridine group, an acridine group, a phenanthroline group, a phenazine group, a benzimidazole group, an isobenzothiazole group, a benzoxazole group, an isobenzoxazole group, a triazole group, a tetrazole group, an oxadiazole group, a triazine group, a thiadiazole group, an imidazopyridine group, an imidazopyrimidine group, and an azacarbazole group, each substituted with at least one selected from a deuterium atom, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, —Si($Q_{31}$)($Q_{32}$)($Q_{33}$), —S(=O)$_2$($Q_{31}$), and —P(=O)($Q_{31}$)($Q_{32}$), wherein $Q_{31}$ to $Q_{33}$ may each independently be selected from a $C_1$-$C_{10}$ alkyl group, a $C_1$-$C_{10}$ alkoxy group, a phenyl group, a biphenyl group, a terphenyl group, and a naphthyl group.

In Formula 601, when xe11 is 2 or greater, at least two $Ar_{601}$(s) may be linked (e.g., coupled) to each other by a single bond.

In one embodiment, in Formula 601, $L_{601}$ may be selected from the group consisting of:

a phenylene group, a naphthylene group, a fluorenylene group, a spiro-bifluorenylene group, a benzofluorenylene group, a dibenzofluorenylene group, a phenanthrenylene group, an anthracenylene group, a fluoranthenylene group, a triphenylenylene group, a pyrenylene group, a chrysenylene group, a perylenylene group, a pentaphenylene group, a hexacenylene group, a pentacenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, a pyridinylene group, an imidazolylene group, a pyrazolylene group, a thiazolylene group, an isothiazolylene group, an oxazolylene group, an isoxazolylene group, a thiadiazolylene group, an oxadiazolylene group, a pyrazinylene group, a pyrimidinylene group, a pyridazinylene group, a triazinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a phenanthridinylene group, an acridinylene group, a phenanthrolinylene group, a phenazinylene group, a benzimidazolylene group, an isobenzothiazolylene group, a benzoxazolylene group, an isobenzoxazolylene group, a triazolylene group, a tetrazolylene group, an imidazopyridinylene group, an imidazopyrimidinylene group, and an azacarbazolylene group; and a phenylene group, a naphthylene group, a fluorenylene group, a spiro-bifluorenylene group, a benzofluorenylene group, a dibenzofluorenylene group, a phenanthrenylene group, an anthracenylene group, a fluoranthenylene group, a triphenylenylene group, a pyrenylene group, a chrysenylene group, a perylenylene group, a pentaphenylene group, a hexacenylene group, a pentacenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, a pyridinylene group, an imidazolylene group, a pyrazolylene group, a thiazolylene group, an isothiazolylene group, an oxazolylene group, an isoxazolylene group, a thiadiazolylene group, an oxadiazolylene group, a pyrazinylene group, a pyrimidinylene group, a pyridazinylene group, a triazinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a phenanthridinylene group, an acridinylene group, a phenanthrolinylene group, a phenazinylene group, a benzimidazolylene group, an isobenzothiazolylene group, a benzoxazolylene group, an isobenzoxazolylene group, a triazolylene group, a tetrazolylene group, an imidazopyridinylene group, an imidazopyrimidinylene group, and an azacarbazolylene group, each substituted with at least one selected from a deuterium atom, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, and an azacarbazolyl group, but embodiments of the present disclosure are not limited thereto.

In one or more embodiments, in Formula 601, xe1 may be 0, 1, or 2.

In one or more embodiments, in Formula 601, $R_{601}$ may be selected from the group consisting of:

a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, and an azacarbazolyl group;

a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, and an azacarbazolyl group, each substituted with at least one selected from a deuterium atom, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, and an azacarbazolyl group; and —S(=O)$_2$(Q$_{601}$) and —P(=O)(Q$_{601}$)(Q$_{602}$), wherein Q$_{601}$ and Q$_{602}$ may each be the same as defined in the present specification.

In one embodiment, the electron transport region 170 may include at least one selected from 2,9-dimethyl-4,7-diphenyl-1,10-phenanthroline (BCP), 4,7-diphenyl-1,10-phenanthroline (Bphen), Alq$_3$, BAlq, 3-(biphenyl-4-yl)-5-(4-tert-butylphenyl)-4-phenyl-4H-1,2,4-triazole (TAZ), NTAZ, and TPBi, but embodiments of the present disclosure are not limited thereto:

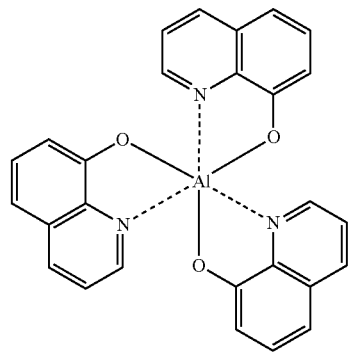

Alq$_3$

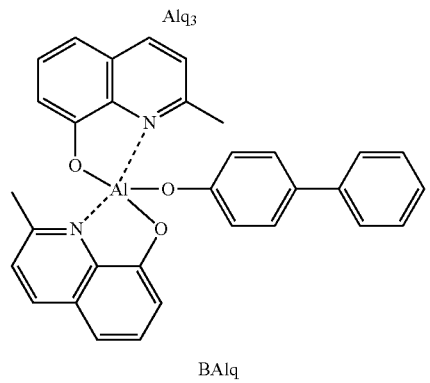

BAlq

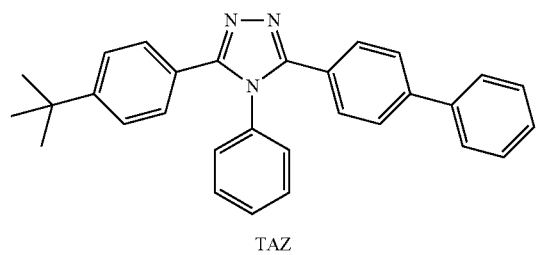

TAZ

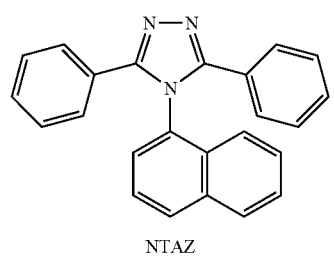

NTAZ

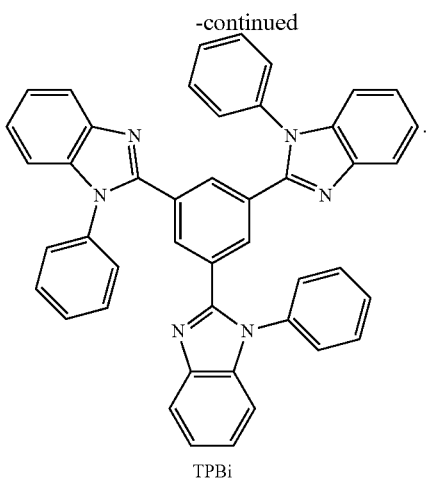

TPBi

The thickness of the electron transport layer may be about 100 Å to about 1,000 Å, and in some embodiments, about 150 Å to about 700 Å. When the thickness of the electron transport layer is within these ranges, electron transport characteristics may be satisfactory without a substantial increase in driving voltage.

The electron transport region 170 (e.g., the electron transport layer in the electron transport region 170) may further include a metal-containing material in addition to the materials described above.

The metal-containing material may include at least one selected from an alkali metal complex and an alkaline earth metal complex. The metal ion (e.g., cation) of the alkali metal complex may be selected from $Li^+$, $Na^+$, $K^+$, $Rb^+$, and $Cs^+$, where a metal ion (e.g., cation) of the alkaline earth metal complex may be selected from $Be^{2+}$, $Mg^{2+}$, $Ca^{2+}$, $Sr^{2+}$, and $Ba^{2+}$. The ligand coordinated to the metal ion of the alkali metal complex or the alkaline earth metal complex may be selected from a hydroxyquinoline, a hydroxyisoquinoline, a hydroxybenzoquinoline, a hydroxyacridine, a hydroxyphenanthridine, a hydroxyphenyl oxazole, a hydroxyphenyl thiazole, a hydroxyphenyl oxadiazole, a hydroxyphenyl thiadiazole, a hydroxyphenyl pyridine, a hydroxyphenyl benzimidazole, a hydroxyphenyl benzothiazole, a bipyridine, a phenanthroline, and a cyclopentadiene, but embodiments of the present disclosure are not limited thereto.

For example, the metal-containing material may include a Li complex. The Li complex may include, for example, Compound ET-D1 (8-hydroxyquinolinato-lithium, LiQ) and/or ET-D2:

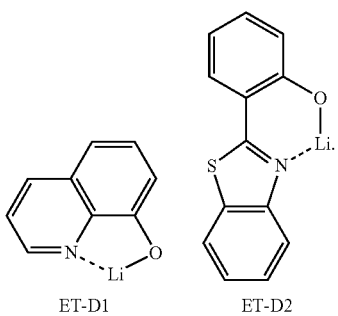

ET-D1                ET-D2

The electron transport region 170 may include an electron injection layer that facilitates electron injection from the second electrode 190. The electron injection layer may be in direct contact with the second electrode 190.

The electron injection layer may have: i) a single-layered structure including (e.g., consisting of) a single material, ii) a single-layered structure including (e.g., consisting of) a plurality of different materials, or iii) a multi-layered structure having a plurality of layers formed of a plurality of different materials.

The electron injection layer may include an alkali metal, an alkaline earth metal, a rare earth metal, an alkali metal compound, an alkaline earth metal compound, a rare earth metal compound, an alkali metal complex, an alkaline earth metal complex, a rare earth metal complex, or a combination thereof.

The alkali metal may be selected from Li, Na, K, Rb, and Cs.

The alkaline earth metal may be selected from Mg, Ca, Sr, and Ba.

The rare earth metal may be selected from scandium (Sc), yttrium (Y), cerium (Ce), ytterbium (Yb), gadolinium (Gd), and terbium (Tb).

The alkali metal compound, alkaline earth metal compound, and rare earth metal compound may be selected from oxide and halide (e.g., fluoride, chloride, bromide, or iodide) compounds of the alkali metal, the alkaline earth metal, and the rare earth metal.

The alkali metal compound may be selected from an alkali metal oxide (such as $Li_2O$, $Cs_2O$, and/or $K_2O$) and an alkali metal halide (such as LiF, NaF, CsF, KF, LiI, NaI, CsI, KI, and/or RbI). In one embodiment, the alkali metal compound may be selected from LiF, $Li_2O$, NaF, LiI, NaI, CsI, KI, and RbI, but embodiments of the present disclosure are not limited thereto.

The alkaline earth metal compound may be selected from alkaline earth metal oxides such as BaO, SrO, CaO, $Ba_xSr_{1-x}O$ (0<x<1), and $Ba_xCa_{1-x}O$ (0<x<1). In one embodiment, the alkaline earth metal compound may be selected from BaO, SrO, and CaO, but embodiments of the present disclosure are not limited thereto.

The rare earth metal compound may be selected from $YbF_3$, $ScF_3$, $ScO_3$, $Y_2O_3$, $Ce_2O_3$, $GdF_3$, and $TbF_3$. In one embodiment, the rare earth metal compound may be selected from $YbF_3$, $ScF_3$, $TbF_3$, $YbI_3$, $ScI_3$, and $TbI_3$, but embodiments of the present disclosure are not limited thereto.

For example, the electron injection layer may include an alkali metal compound (e.g., RbI) and/or a rare earth metal (e.g., Yb), but embodiments of the present disclosure are not limited thereto.

The alkali metal complex, alkaline earth metal complex, and rare earth metal complex include alkali metal ions, alkaline earth metal ions, and rare earth metal ions, respectively (as described above), and the ligands coordinated to the metal ion of the alkali metal complex, alkaline earth metal complex, and rare earth metal complex may be selected from a hydroxyquinoline, a hydroxyisoquinoline, a hydroxybenzoquinoline, a hydroxyacridine, a hydroxyphenanthridine, a hydroxyphenyl oxazole, a hydroxyphenyl thiazole, a hydroxyphenyl oxadiazole, a hydroxyphenyl thiadiazole, a hydroxyphenyl pyridine, a hydroxyphenyl benzimidazole, a hydroxyphenyl benzothiazole, a bipyridine, a phenanthroline, and a cyclopentadiene, but embodiments of the present disclosure are not limited thereto.

The electron injection layer may be formed of an alkali metal, an alkaline earth metal, a rare earth metal, an alkali metal compound, an alkaline earth metal compound, a rare earth metal compound, an alkali metal complex, an alkaline earth metal complex, a rare earth metal complex, or a combination thereof, and may further include the organic material described above. When the electron injection layer further includes the organic material, the alkali metal, the alkaline earth metal, the rare earth metal, the alkali metal compound, the alkaline earth metal compound, the rare earth metal compound, the alkali metal complex, the alkaline earth metal complex, the rare earth metal complex, or the combination thereof may be homogenously or non-homogeneously dispersed in a matrix formed of the organic material.

The thickness of the electron injection layer may be about 1 Å to about 100 Å, and in some embodiments, about 3 Å to about 90 Å. When the thickness of the electron injection layer is within these ranges, electron injection characteristics may be satisfactory without a substantial increase in driving voltage.

[Second Electrode 190]

A second electrode 190 is on the electron transport region 170. The second electrode 190 may be a cathode that is an electron injection electrode, and in this regard, a material for forming the second electrode 190 may be a material having a low work function, such as a metal, an alloy, an electrically conductive compound, or a combination thereof.

The second electrode 190 may include at least one selected from lithium (Li), silver (Ag), magnesium (Mg), aluminum (Al), aluminum-lithium (Al—Li), calcium (Ca), magnesium-indium (Mg—In), magnesium-silver (Mg—Ag), and silver-magnesium (Ag—Mg), but embodiments of the present disclosure are not limited thereto. The second electrode 190 may be a transmissive electrode, a semi-transmissive electrode, or a reflective electrode.

The second electrode 190 may have a single-layer structure, or a multi-layer structure including a plurality of layers.

Each layer included in the hole transport region 130 and each layer included in the electron transport region 170 may be formed on a predetermined or specific region using one or more suitable methods (such as vacuum-deposition, spin coating, casting, a Langmuir-Blodgett (LB) method, ink-jet printing, laser-printing, and/or laser-induced thermal imaging (LITI)).

When each of the layers in the hole transport region 130 and the electron transport region 170 is formed by vacuum deposition, the deposition may be performed, e.g., at a deposition temperature of about 100° C. to about 500° C., a vacuum degree of about $10^{-8}$ torr to about $10^{-3}$ torr, and a deposition rate of about 0.01 Å/sec to about 100 Å/sec, taking into account the material for forming the layer to be deposited and a structure of the layer to be formed.

When each of the layers in the hole transport region 130 and the electron transport region 170 is formed by spin coating, the coating may be performed, e.g., at a coating speed of about 2,000 rpm to about 5,000 rpm and at a heat-treating temperature of about 80° C. to about 200° C., taking into account the material for forming the layer to be deposited and a structure of the layer to be formed.

Hereinafter, a thin layer and an optoelectronic device according to an embodiment of the present disclosure will be described in more detail.

EXAMPLE

Example 1

$CH_3NH_3I$, $TmI_2$, and $EuI_2$ were co-deposited on a glass substrate at a molar ratio of 1:0.05:0.95 to form a precursor-containing layer including $CH_3NH_3I$, $TmI_2$, and $EuI_2$. The precursor-containing layer was heat-treated at about 100° C. for 15 minutes to form a thin layer having a thickness of 40 nm and including $(CH_3NH_3)(Tm_{0.05}Eu_{0.95})I_3$.

Example 2

A thin layer having a thickness of 40 nm and including $(CH_3NH_3)(Tm_{0.2}Eu_{0.8})I_3$ was formed in substantially the same manner as in Example 1, except that a precursor-containing layer including $CH_3NH_3I$, $TmI_2$, and $EuI_2$ at a molar ratio of 1:0.2:0.8 was formed.

Example 3

A thin layer having a thickness of 40 nm and including $(CH_3NH_3)(Tm_{0.4}Eu_{0.6})I_3$ was formed in substantially the same manner as in Example 1, except that a precursor-containing layer including $CH_3NH_3I$, $TmI_2$, and $EuI_2$ at a molar ratio of 1:0.4:0.6 was formed.

Comparative Example 1

A thin layer having a thickness of 40 nm and including $(CH_3NH_3)PbI_3$ was formed in substantially the same manner as in Example 1, except that $CH_3NH_3I$ and $PbI_2$ were co-deposited on the glass substrate at a molar ratio of 1:1 to form a precursor-containing layer including $CH_3NH_3I$ and $PbI_2$.

Comparative Example 2

A thin layer having a thickness of 40 nm and including $(CH_3NH_3)PbBr_3$ was formed in substantially the same manner as in Example 1, except that $CH_3NH_3Br$ and $PbBr_2$ were co-deposited on the glass substrate at a molar ratio of 1:1 to form a precursor-containing layer including $CH_3NH_3Br$ and $PbBr_2$.

Comparative Example 3

A thin layer having a thickness of 40 nm and including $(CH_3NH_3)EuI_3$ was formed in substantially the same manner as in Example 1, except that $CH_3NH_3I$ and $EuI_2$ were co-deposited on the glass substrate at a molar ratio of 1:1 to form a precursor-containing layer including $CH_3NH_3I$ and $EuI_2$.

Evaluation Example 1: Evaluation of Quantum Efficiency (PLQY) and Full Width Half Maximum (FWHM) in Film Quantum efficiencies (PLQYs) and FWHMs in films of the thin layers prepared in Examples 1 to 3 and Comparative Examples 1 to 3 were evaluated, and the results are shown in Table 1. The luminescence quantum yield in films of each of the thin layers was evaluated using a Hamamatsu Photonics absolute PL quantum yield measurement system equipped with a xenon light source, a monochromator, a photonic multichannel analyzer, and an integrating sphere, in conjunction with PLQY measurement software (Hamamatsu Photonics, Ltd., Shizuoka, Japan). The full width at half-maximum (FWHM) of a photoluminescence peak for each of the thin layers was evaluated by analyzing a PL spectrum obtained using an ISS PC1 Spectrofluorimeter.

TABLE 1

| | Thin layer composition | PLQY (%) | FWHM (nm) |
|---|---|---|---|
| Example 1 | $(CH_3NH_3)(Tm_{0.05}Eu_{0.95})I_3$ | 91 | 23 |
| Example 2 | $(CH_3NH_3)(Tm_{0.2}Eu_{0.8})I_3$ | 95 | 25 |
| Example 3 | $(CH_3NH_3)(Tm_{0.4}Eu_{0.6})I_3$ | 92 | 27 |
| Comparative Example 1 | $(CH_3NH_3)PbI_3$ | 86 | 29 |
| Comparative Example 2 | $(CH_3NH_3)PbBr_3$ | 74 | 31 |
| Comparative Example 3 | $(CH_3NH_3)EuI_3$ | 88 | 30 |

Referring to Table 1, it may be confirmed that the thin layers of Examples 1 to 3 had higher PLQYs and narrower FWHMs, compared to the thin layers of Comparative Examples 1 to 3.

Example 11

Formation of Hole Transport Region

An indium tin oxide (ITO) glass substrate (as a substrate and an anode) with a thickness of 15 Ω/cm² (100 nm) (Corning, Inc.) was cut to a size of 50 mm×50 mm×0.5 mm, sonicated in acetone, isopropyl alcohol, and pure water for 15 minutes each, and then cleaned with UV and ozone for 30 minutes. Then, the ITO glass substrate was placed in a vacuum deposition device.

CuI was deposited on the ITO anode to form a hole transport layer having a thickness of 80 nm, and thus a hole transport region was formed.

Formation of Emission Layer

An emission layer having a thickness of 40 nm and including $(CH_3NH_3)(Tm_{0.05}Eu_{0.95})I_3$ was formed on the hole transport region in substantially the same manner as in Example 1.

Formation of Electron Transport Region

TPBi was deposited on the emission layer to form an electron transport layer having a thickness of 50 nm, and RbI and Yb were co-deposited at a volume ratio of 1:1 on the electron transport layer to form an electron injection layer having a thickness of 1.5 nm, and thus an electron transport region was formed.

Formation of Cathode

Ag and Mg were co-deposited on the electron transport region at a volume ratio of 9:1 to form a cathode having a thickness of 10 nm, and thus a light-emitting diode having a structure of ITO (100 nm)/CuI (80 nm)/$(CH_3NH_3)(Tm_{0.05}Eu_{0.95})I_3$ (40 nm)/TPBi (50 nm)/RbI:Yb (1.5 nm)/AgMg (Mg 10 vol %, 10 nm) was formed.

Examples 12 and 13 and Comparative Examples 11 to 13

A light-emitting diode was prepared in substantially the same manner as in Example 11, except that the preparation methods used for the thin layers of Examples 2 and 3 and Comparative Examples 1 to 3 were used during formation of the emission layer, respectively, instead of the preparation method of the thin layer of Example 1.

Evaluation Example 2

Driving voltages, external quantum efficiencies, and maximum efficiencies of the light-emitting diodes prepared in Examples 11 to 13 and Comparative Examples 11 to 13 at 5 mA/cm² were measured using a Keithley SMU 236 and a luminance meter PR650, and the results are shown in Table 2:

TABLE 2

| | Emission layer composition | Driving voltage (V) | External quantum efficiency (EQE) (%) | Maximum efficiency (Max. CE) (cd/A) |
|---|---|---|---|---|
| Example 11 | $(CH_3NH_3)(Tm_{0.05}Eu_{0.95})I_3$ | 4.2 | 1.2 | 1.3 |
| Example 12 | $(CH_3NH_3)(Tm_{0.2}Eu_{0.8})I_3$ | 4.5 | 2 | 2.2 |
| Example 13 | $(CH_3NH_3)(Tm_{0.4}Eu_{0.6})I_3$ | 4.7 | 1.5 | 1.8 |
| Comparative Example 11 | $(CH_3NH_3)PbI_3$ | 5.2 | 0.21 | 0.22 |
| Comparative Example 12 | $(CH_3NH_3)PbBr_3$ | 4.8 | 0.83 | 0.48 |
| Comparative Example 13 | $(CH_3NH_3)EuI_3$ | 4.5 | 0.92 | 0.8 |

Referring to Table 2, it may be confirmed that the light-emitting diodes prepared in Examples 11 to 13 had lower driving voltages, higher external quantum efficiencies, and higher maximum efficiencies compared to the light-emitting diodes prepared in Comparative Examples 11 to 13.

As described above, according to one or more embodiments of the present disclosure, an optoelectronic device including the perovskite compound and/or a thin layer including the perovskite compound may have high efficiency and/or long lifespan.

It should be understood that embodiments described herein should be considered in a descriptive sense only and not for purposes of limitation. Descriptions of features or aspects within each embodiment should typically be considered as being available for other similar features or aspects in other embodiments.

As used herein, the terms "use", "using", and "used" may be considered synonymous with the terms "utilize", "utilizing", and "utilized", respectively. In addition, the terms "substantially", "about", and similar terms are used as terms of approximation and not as terms of degree, and are intended to account for the inherent deviations in measured or calculated values that would be recognized by those of ordinary skill in the art.

Also, any numerical range recited herein is intended to include all subranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

While one or more embodiments have been described with reference to the drawing, it will be understood by those of ordinary skill in the art that various changes in form and details may be made therein without departing from the spirit and scope of the present disclosure, as defined by the following claims and equivalents thereof.

What is claimed is:

1. A perovskite compound represented by Formula 1:

$$[A][B^1{}_n B^2{}_{(1-n)}][X]_3, \qquad \text{Formula 1}$$

wherein the perovskite compound is an $ABX_3$ perovskite, and in Formula 1,

A is at least one selected from a monovalent organic cation, a monovalent inorganic cation, and combinations thereof;

$B^1$ is a $Tm^{2+}$ ion;

$B^2$ is at least one selected from a divalent inorganic cation, where $B^2$ is free of $Tm^{2+}$ ion;

n is a real number that satisfies $0<n\leq1$; and

X is at least one monovalent anion.

2. The perovskite compound of claim 1, wherein A is $(R_1R_2R_3R_4N)^+$, $(R_1R_2R_3R_4P)^+$, $(R_1R_2R_3R_4As)^+$, $(R_1R_2R_3R_4Sb)^+$, $(R_1R_2N=C(R_3)-NR_4R_5)^+$, a monovalent cation of a substituted or unsubstituted nitrogen-containing 5-membered ring, a monovalent cation of a substituted or unsubstituted nitrogen-containing 6-membered ring, $Li^+$, $Na^+$, $K^+$, $Rb^+$, $Cs^+$, $Fr^+$, or a combination thereof, wherein $R_1$ to $R_5$, a substituent of the monovalent cation of the substituted nitrogen-containing 5-membered ring, and a substituent of the monovalent cation of the substituted nitrogen-containing 6-membered ring are each independently selected from a hydrogen atom, a deuterium atom, —F, —Cl, —Br, —I, a hydroxyl group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_6$-$C_{60}$ aryl group, and —$N(Q_1)(Q_2)(Q_3)$, and wherein $Q_1$ to $Q_3$ are each independently selected from a hydrogen atom, a deuterium atom, a hydroxyl group, a $C_1$-$C_{60}$ alkyl group, a $C_2$-$C_{60}$ alkenyl group, a $C_2$-$C_{60}$ alkynyl group, a $C_1$-$C_{60}$ alkoxy group, and a $C_6$-$C_{60}$ aryl group.

3. The perovskite compound of claim 1, wherein A is $(R_1R_2R_3R_4N)^+$, $(R_1R_2R_3R_4P)^+$, $(R_1R_2R_3R_4As)^+$, $(R_1R_2R_3R_4Sb)^+$, or a combination thereof, wherein $R_1$ to $R_4$ are each independently selected from a hydrogen atom, a deuterium atom, —F, —Cl, —Br, —I, a hydroxyl group, a $C_1$-$C_{20}$ alkyl group, a $C_1$-$C_{20}$ alkoxy group, and —$N(Q_1)(Q_2)(Q_3)$, and wherein $Q_1$ to $Q_3$ are each independently selected from a hydrogen atom, a deuterium atom, a hydroxyl group, a $C_1$-$C_{20}$ alkyl group, and a $C_1$-$C_{20}$ alkoxy group.

4. The perovskite compound of claim 1, wherein A is $(CH_3NH_3)^+$, $(C_2H_6PH_2)^+$, $(CH_3AsH_3)^+$, $(NH_4)^+$, $(CH_3SbH_3)^+$, $(PH_4)^+$, $(PF_4)^+$, $(CH_3PH_3)^+$, $(SbH_4)^+$, $(AsH_4)^+$, $(NCl_4)^+$, $(NH_3OH)^+$, $(NH_3NH_2)^+$, $(CH(NH_2)_2)^+$, $(C_3N_2H_5)^+$, $((CH_3)_2NH_2)^+$, $(NC_4H_8)^+$, $((CH_3CH_2)NH_3)^+$, $((NH_2)_3C)^+$, or a combination thereof.

5. The perovskite compound of claim 1, wherein $B^2$ is a divalent cation of a rare earth metal, a divalent cation of an alkaline earth metal, or a combination thereof.

6. The perovskite compound of claim 1, wherein $B^2$ is $La^{2+}$, $Ce^{2+}$, $Pr^{2+}$, $Nd^{2+}$, $Pm^{2+}$, $Eu^{2+}$, $Gd^{2+}$, $Tb^{2+}$, $Ho^{2+}$, $Er^{2+}$, $Yb^{2+}$, $Lu^{2+}$, $Be^{2+}$, $Mg^{2+}$, $Ca^{2+}$, $Sr^{2+}$, $Ba^{2+}$, $Ra^{2+}$, or a combination thereof.

7. The perovskite compound of claim 1, wherein $B^2$ is $Eu^{2+}$.

8. The perovskite compound of claim 1, wherein n is a real number that satisfies $0.05\leq n\leq 0.4$.

9. The perovskite compound of claim 1, wherein:

n is a real number that satisfies $0.01\leq n\leq 0.14$, and the perovskite compound emits blue light;

n is a real number that satisfies $0.15\leq n\leq 0.34$, and the perovskite compound emits green light; or n is a real number that satisfies $0.35\leq n\leq 0.5$, and the perovskite compound emits red light.

10. The perovskite compound of claim 1, wherein X is at least one halide anion.

11. The perovskite compound of claim 1, wherein X is —I.

12. A thin layer comprising the perovskite compound of claim 1.

13. An optoelectronic device comprising the perovskite compound of claim 1.

14. The optoelectronic device of claim 13, wherein the optoelectronic device is a photovoltaic device, a photodiode, a phototransistor, a photomultiplier, a photo-resistor, a photo-detector, a light sensitive detector, a solid-state triode, a battery electrode, a light-emitting device, a light-emitting diode, a transistor, a solar battery, a laser, or a diode injection laser.

15. The optoelectronic device of claim 13, wherein the optoelectronic device is a light-emitting diode, and the light-emitting diode comprises:

a first electrode;

a second electrode facing the first electrode; and an emission layer between the first electrode and the second electrode, wherein the emission layer comprises the perovskite compound.

16. The optoelectronic device of claim 15, further comprising at least one selected from a hole transport region between the first electrode and the emission layer and an electron transport region between the emission layer and the second electrode, wherein the at least one selected from the hole transport region and the electron transport region comprises a metal halide, a metal oxide, a metal chalcogenide, a metal selenide, or a combination thereof.

17. The optoelectronic device of claim 15, further comprising at least one selected from a hole transport region between the first electrode and the emission layer and an electron transport region between the emission layer and the second electrode, wherein the at least one selected from the hole transport region and electron transport region comprises a group IV compound semiconductor, a group III-V semiconductor, a group II-VI semiconductor, a group I-VII semiconductor, a group IV-VI semiconductor, a group V-VI semiconductor, a group II-V semiconductor, a ternary or quaternary semiconductor, or a combination thereof.

18. The optoelectronic device of claim 15, further comprising at least one selected from a hole transport region between the first electrode and the emission layer and an electron transport region between the emission layer and the second electrode, wherein the hole transport region comprises an amine-based compound; or the electron transport region comprises a metal-free compound that comprises at least one π electron deficient nitrogen-containing ring.

19. The optoelectronic device of claim 15, further comprising an electron transport region between the emission layer and the second electrode, wherein the electron transport region comprises an electron injection layer, wherein the electron injection layer comprises an alkali metal, an alkaline earth metal, a rare earth metal, an alkali metal compound, an alkaline earth metal compound, a rare earth metal compound, an alkali metal complex, an alkaline earth metal complex, a rare earth metal complex, or a combination thereof.

20. The optoelectronic device of claim 13, wherein the optoelectronic device is a light-emitting diode, and the light-emitting diode comprises:
- a first electrode;
- a second electrode facing the first electrode;
- an emission layer between the first electrode and the second electrode; and
- at least one selected from a hole transport region between the first electrode and the emission layer, and an electron transport region between the emission layer and the second electrode,
- wherein at least one selected from the hole transport region and the electron transport region comprises the perovskite compound.

* * * * *